United States Patent [19]
Wright

[11] Patent Number: 5,406,159
[45] Date of Patent: Apr. 11, 1995

[54] SURFACE ACOUSTIC WAVE GRATINGS HAVING SELECTED REFLECTIVITY

[75] Inventor: Peter V. Wright, Dallas, Tex.

[73] Assignee: RF Monolithics, Inc., Dallas, Tex.

[21] Appl. No.: 152,179

[22] Filed: Nov. 11, 1993

[51] Int. Cl.⁶ .......................................... H01L 41/08
[52] U.S. Cl. ................................................ 310/313 D
[58] Field of Search ........................ 310/313 B, 313 D

[56] References Cited

U.S. PATENT DOCUMENTS

| | | | |
|---|---|---|---|
| 4,155,056 | 5/1979 | Crass et al. | 333/195 |
| 4,217,563 | 8/1980 | Vale | 333/150 |
| 4,485,364 | 11/1984 | DeVries | 310/313 D |
| 4,661,738 | 4/1987 | Skeie | 310/313 D |
| 4,902,925 | 2/1990 | Wright | 310/313 B |
| 4,910,839 | 3/1990 | Wright | 29/25.35 |
| 5,051,644 | 9/1991 | Wright | 310/313 B |
| 5,061,871 | 10/1991 | Wright | 310/33 B |
| 5,073,763 | 12/1991 | Wright | 310/313 B |
| 5,103,324 | 4/1992 | Brandstetter | 359/9 |
| 5,289,073 | 2/1994 | Mariani | 310/313 D |
| 5,306,978 | 4/1994 | Yamanouchi et al. | 310/313 B |

FOREIGN PATENT DOCUMENTS 1006916  1/1986  Japan .................. 310/313 B Primary Examiner—Thomas M. Dougherty
Attorney, Agent, or Firm—Jones, Day, Reavis & Pogue

[57] ABSTRACT

An improved surface acoustic wave grating structure that utilizes four electrodes per $3\lambda/2$ or $5\lambda/2$ transduction length of a reflector grating structure that produces a desired net internal distributed reflectivity in both magnitude and phase.

6 Claims, 2 Drawing Sheets

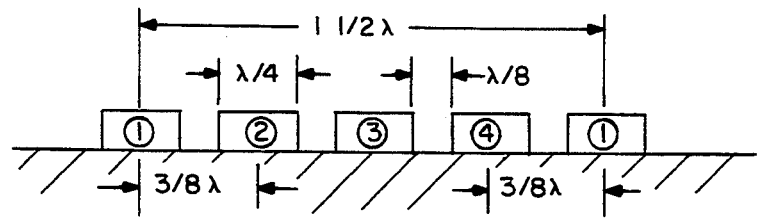
FIG. 1
PRIOR ART
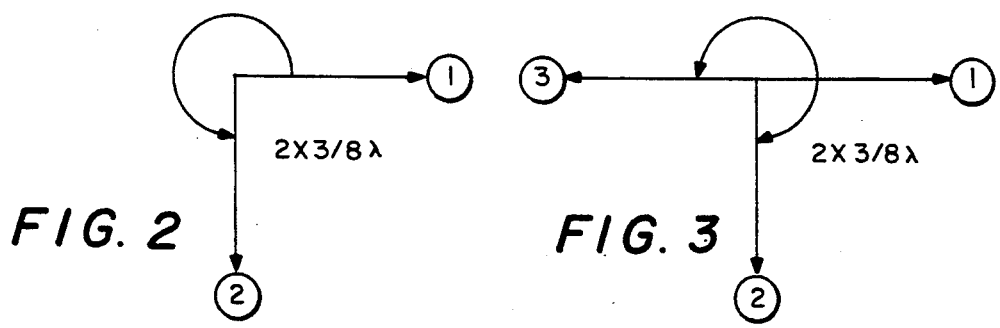
FIG. 2     FIG. 3
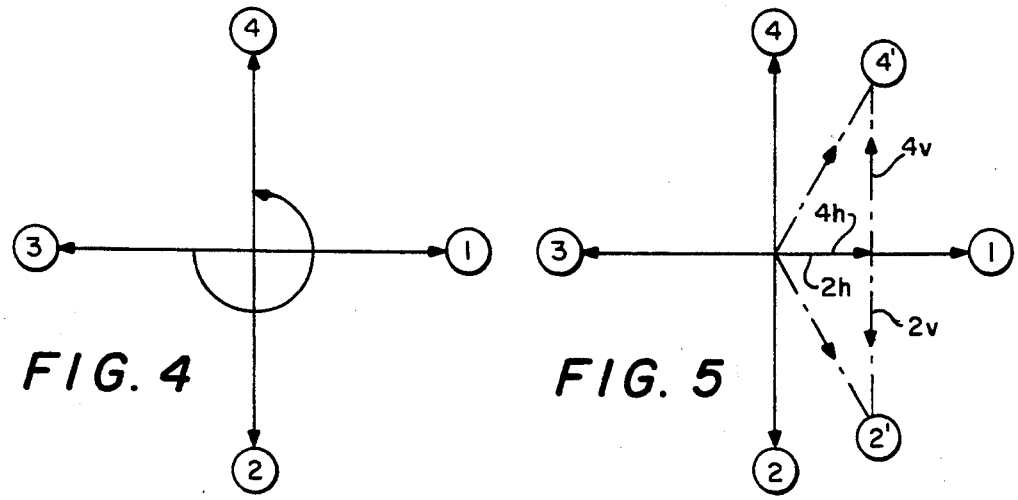
FIG. 4     FIG. 5
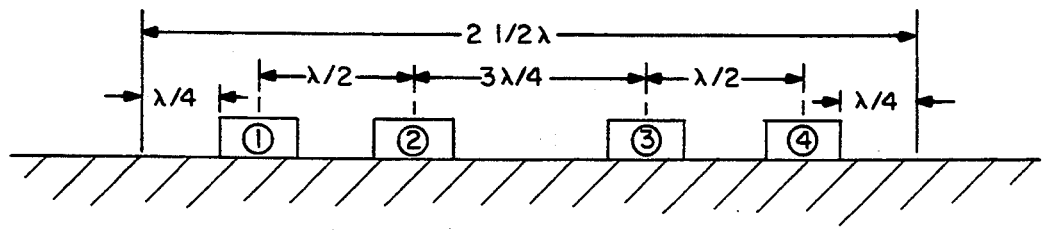
FIG. 6
PRIOR ART

SURFACE ACOUSTIC WAVE GRATINGS HAVING SELECTED REFLECTIVITY

FIELD OF THE INVENTION

The present invention relates in general to surface acoustic wave transducers and in particular to a transducer reflector grating having a pattern of electrodes on a piezoelectric substrate formed of four substantially equal width, single-level, interdigitated electrodes per each 1½ wavelengths or 2½ wavelengths of the grating structure and being spaced such that a desired reflectivity other than zero is obtained, thereby enabling a grating structure to be obtained that has a reflectivity of predetermined magnitude and phase.

BACKGROUND OF THE INVENTION

Surface acoustic wave devices, known as SAW devices, have many uses in the UHF and VHF frequency ranges. SAW devices have been especially useful as impedance elements, resonators, and band-pass filters in these frequency ranges. Typical SAW devices have a substrate with at least a surface layer of piezoelectric material and surface acoustic wave transducers in interdigitated form disposed on the piezoelectric surface. The transducers convert an electrical signal to surface acoustic waves propagating on the piezoelectric surface. Such transducers may also include grating structures.

Yet a further concept for implementing a unidirectional single-phase transducer is set forth in U.S. Pat. No. 4,162,465. The approach described therein employs electrodes of varying widths to achieve the desired unidirectional characteristics. This approach has the advantage of being single level. However, in general, the gaps and electrode widths in such a structure are required to be significantly smaller than in conventional SAW transducers. This is a significant drawback to its practical implementation.

SAW devices are compact, lightweight, robust, and, because they are a planar technology, are economical to manufacture. They can be mass-produced using the same techniques developed so successfully for the production of silicon integrated circuits. A wide variety of analog signal processing functions can be achieved with SAW devices. Among other applications, they are currently used in pulse compression radar systems as receiver band-pass filters or as resonators for stabilizing oscillators in numerous applications. They have replaced many of the coils, capacitors, and metal cavities of conventional radio frequency systems, removing the need for hand alignment and dramatically improving the reliability and performance of such systems. They have simultaneously resulted in significant reductions in both size and cost.

However, several problems are associated with the prior art surface acoustic wave transducers. One of the problems occurs because the transducer electrodes cause internal reflections which distort the transducer output and the shape of the input conductance which, in most cases, is undesirable. Another problem occurs when the transducer is used in filter applications. Triple transit distortion is caused by regeneration reflections between the transducers.

In order to eliminate triple transit distortion, three-phase, group type, and single-phase devices are used to cause a greater amount of radiation in one direction in the crystal than in the reverse direction and thus form unidirectional transducers. One such device is disclosed in commonly assigned U.S. Pat. No. 4,902,925, commonly known as the "Hopscotch", and is incorporated herein by reference in its entirety. This structure employed a group type sampling with all electrode widths being λ/4. The first level of the transducer, by virtue of the electrode groupings, has no net internal reflections. Unidirectionality is achieved only by the addition of a second level metalization or by the inclusion of grooves with this structure.

Another concept for a single-phase unidirectional transducer is set forth in commonly assigned U.S. Pat. No. 4,910,839 in which, with unique crystal orientations, a simple two-electrode-per-wavelength transducer exhibited unidirectional characteristics. With this device the sense of directionality is determined by the material properties of the crystal substrate and overlay material, rather than by the transducer configuration as with other approaches.

Also, in commonly assigned U.S. Pat. No. 5,073,763, incorporated herein by reference in its entirety, a class of group-type single-phase unidirectional transducers were disclosed that can obtain unidirectional characteristics on conventional or natural crystal orientations. The sense of unidirectionality can be reversed by a change to the second level metalization or, again, by the inclusion of grooves. This transducer operated with $3/8\lambda$ and $5/8\lambda$ sampling. In these devices, the single-level versions are reflectionless. Thus, unidirectional characteristics are obtained only from the two-level structure.

Associated with many of these transducers are reflector gratings that have the same reflection problems of the transducers. It would be advantageous to have a grating structure for a surface acoustic wave device that has unidirectional characteristics with only single-level metal and practical electrode widths and gap dimensions.

SUMMARY OF THE INVENTION

The phrase "surface acoustic wave" device, as used herein includes Rayleigh waves, surface transverse waves, leaky waves, and the like. The present invention is a surface acoustic wave transducer grating structure that has substantially equal width, single-level, interdigitated electrodes that are spaced in a particular wavelength such that a desired reflectivity other than zero is obtained. This pattern of electrodes includes four equal width, single-level, interdigitated electrodes occurring substantially per each 1¼ wavelengths or 2¼ wavelengths of the grating.

It is clear from U.S. Pat. No. 5,073,763 that in a transducer with a pattern of interdigitated electrodes on a piezoelectric substrate lying on a grid such that adjacent electrodes have a center-to-center spacing of either $3/8\lambda$ or $5/8\lambda$ that no net reflections exist because the reflections from the individual electrodes cancel each other. The same analysis is true with a transducer reflector grating having a pattern of interdigitated electrodes such that adjacent electrodes have a center-to-center spacing of either $3/8\lambda$ or $5/8\lambda$ where λ equals one wavelength. Again, there are no net reflections since the reflections from individual electrodes end up cancelling each other because of the travel path of the reflected waves from one electrode to another causing the reflected waves arriving at an other electrode to be 180° out of phase to provide the cancellation.

With the present invention, equal width electrodes are selectively positioned to achieve a finite localized reflection function in a reflector grating in both magnitude and phase. Such an algorithm can be easily implemented on a computer by one skilled in the art.

The average separation of the grating electrodes, center-to-center, is either $3/8\lambda$ or $5/8\lambda$. Thus, there are substantially four electrodes per every $1\frac{1}{2}\lambda$ transduction lengths or four electrodes in every $2\frac{1}{2}\lambda$ transduction lengths, respectively. The center-to-center spacings of the electrodes in the new invention are not all equal so as to enable the achievement of a desired finite reflectivity.

The invention is achieved by entering into a computer minimum electrode width and gap constraints compatible with manufacturability, the desired frequency characteristics of the grating structure, the substrate characteristics, and electrode material characteristics, and calculating with the computer the electrode positions with each substantially $1\frac{1}{2}\lambda$ or $2\frac{1}{2}\lambda$ wavelengths that results in a best approximation of the desired reflectivity of the electrodes in both phase and magnitude.

Thus a grating structure with single-level electrodes having a desired distributed internal reflection function can be implemented. Both the phase angle and magnitude of the distributed internal reflections can be achieved in a continuous manner within the grating structure and the grating structure can be caused to be substantially unidirectional if desired.

Thus it is an object of the present invention to provide a surface acoustic wave reflector grating with a simple pattern of single-level electrodes that provide unidirectional transmission.

It is also an object of the present invention to provide a surface acoustic wave reflector grating structure that has the electrodes spaced substantially within each $1\frac{1}{2}$ or $2\frac{1}{2}$ wavelengths of the transduction length of the grating such that a predetermined desired distributed internal reflectivity other than zero is obtained.

It is yet another object of the present invention to provide a surface acoustic wave reflector grating structure that has a pattern of equal width, single-level electrodes on a piezoelectric substrate that are spaced substantially within each $1\frac{1}{2}$ or $2\frac{1}{2}$ wavelengths of the transduction length of the reflector grating such that a unidirectional grating structure is obtained.

Thus the present invention relates to an improved surface acoustic wave grating structure having a transduction length and comprising a piezoelectric substrate, a pattern of electrodes on the substrate forming the transduction length, the pattern being formed of four equal width, single-level, interdigitated electrodes substantially per each $1\frac{1}{2}\lambda$ or $2\frac{1}{2}\lambda$ transduction lengths of the grating structure, and said electrodes being spaced such that a desired distributed internal reflectivity other than zero is obtained.

BRIEF DESCRIPTION OF THE DRAWINGS

These and other objects of the present invention will be more fully disclosed in conjunction with the DETAILED DESCRIPTION OF THE DRAWINGS in which:

FIG. 1 is a diagrammatic representation of the $3/8\lambda$ spacing of the electrodes in U.S. Pat. No. 5,073,763;

FIG. 2 is a vector representation of the reflectivity of the first and second electrodes of the device of FIG. 1;

FIG. 3 is a vector representation of the reflectivity of the first three electrodes of the device in FIG. 1;

FIG. 4 is a vector representation of the reflectivity of all four electrodes of the device in FIG. 1 illustrating how the reflections are cancelled;

FIG. 5 is a vector representation illustrating how unidirectionality is obtained when the reflectivity of two of the electrodes are shifted in phase;

FIG. 6 is a diagrammatic representation of a $5/8\lambda$ device in which four electrodes are spaced within a $2\frac{1}{2}\lambda$ transduction length;

DETAILED DESCRIPTION OF THE DRAWINGS

Figure 7:
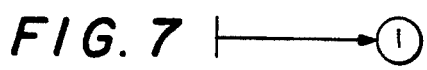
FIGS. 7, 8, 9 and 10 illustrate the manner in which the electrodes of FIG. 6 provide a cancellation of reflections such that no net reflections occur in the $5/8\lambda$ device.

FIG. 1 illustrates the prior art arrangement of $3/8\lambda$ group sampling to obtain a reflectionless transducer as disclosed in U.S. Pat. No. 5,073,763. As can be seen in FIG. 1, four single electrodes 1, 2, 3, and 4, are located within a transduction length of $1\frac{1}{2}$ wavelengths. A transduction length is defined herein as a length of a transducer in which the electrodes are coupled to a signal bus and in which transduction is occurring. As can be seen in FIG. 1, each of the four electrodes are $\lambda/4$ and have a center-to-center spacing of $3/8\lambda$.

FIGS. 2, 3, and 4 illustrate how the device of FIG. 1 produces no net reflections. Assume in FIG. 2 that the reflection from electrode 1 has a phase as shown. The reflection from electrode 2 travels back to electrode 1 in a travel path of two times the $3/8\lambda$ spacing of the adjacent electrodes or $6/8\lambda$ or $3/4\lambda$. Thus as shown in FIG. 2, the second electrode produces a reflection $\frac{3}{4}$ths of a wavelength or 270° later. The reflection between the second and third electrodes again is twice the $3/8\lambda$ electrode separation or $3/4\lambda$ as shown in FIG. 3. Thus the reflection of electrode 3 exactly opposes the reflection of electrode 1. Finally, as can be seen in FIG. 4, the reflection between the third and fourth electrodes occurs again twice the separation distance of $3/8\lambda$ or $3/4\lambda$ and, as shown in FIG. 4, the reflection from electrode 4 exactly cancels the reflection of electrode 2. Thus there is no net reflection from the device of FIG. 1.

Clearly, as can be seen in FIG. 5, if the reflection of the electrodes could be phase shifted then a net reflection could be obtained. For instance, as illustrated in FIG. 5 if the reflection from electrode 2 could be phase shifted to the point or position illustrated by 2' and the reflection of electrode 4 could be shifted to the position represented by 4', then the reflection from electrodes 1 and 3 would still cancel, the vertical components 2V and 4V would cancel leaving the horizontal components 2H and 4H which would be added together to provide unidirectional reflectivity to the right in FIG. 5.

Figure 8:
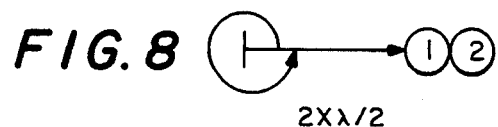
Figure 9:
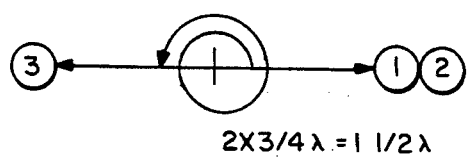
Figure 10:
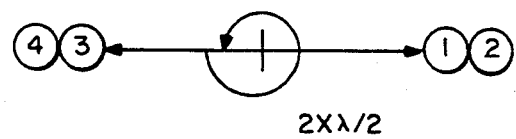

FIG. 6 illustrates the structure for a 5/8λ group sampling as disclosed in U.S. Pat. No. 5,073,763. Again, there are four electrodes spaced nonuniformly within a 2½λ transduction length. As can be seen in FIGS. 7, 8, 9 and 10, the net reflection from such structure is zero. FIG. 7 illustrates the reflection at a given phase represented by electrode 1. Since the electrode 2 is spaced λ/2 from electrode 1, the reflection from electrode 2 arrives back at electrode 1 in phase with the reflection from electrode 1 as illustrated in FIG. 8. The reflection from electrode 3 has to travel twice the 3λ/4 separation or 1½λ such as shown in FIG. 9, such that the reflection from electrode 3 opposes the reflection of electrodes 1 and 2. The reflection of electrode 4, however, again travels a round-trip distance to electrode 3 of 2 times λ/2 or λ and thus ends up in phase with the reflection of electrode 3 as shown in FIG. 10. Clearly, as can be seen in FIG. 10, the reflections of electrodes 1 and 2 cancel the reflections of electrodes 3 and 4.

Figure 11:
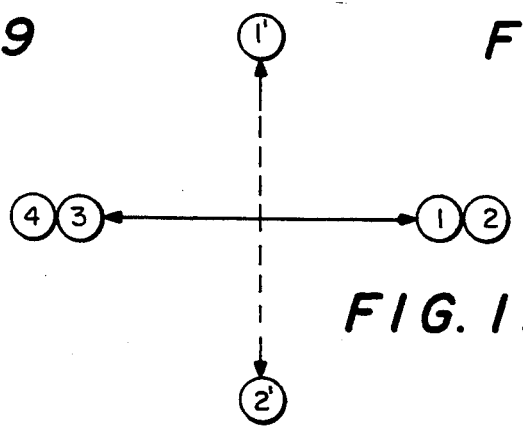
FIG. 11 is a vector representation similar to that illustrated in FIG. 10 showing how unidirectionality can be obtained by phase shifting two of the reflection vectors.

Suppose, however, the reflection from each of the electrodes 1 and 2 could be phase shifted 90° each to the positions shown in FIG. 11 by reflections 1' and 2'. Clearly then, the reflections from 1' and 2' exactly cancel leaving the reflections 3 and 4 to be additive to the left in FIG. 11. Thus, the reflection from the device in FIG. 5 would be unidirectional to the left if such variation in phase could be achieved.

The above analysis of surface acoustic wave transducers applies equally to a reflector grating structure for SAW devices.

Figure 12:
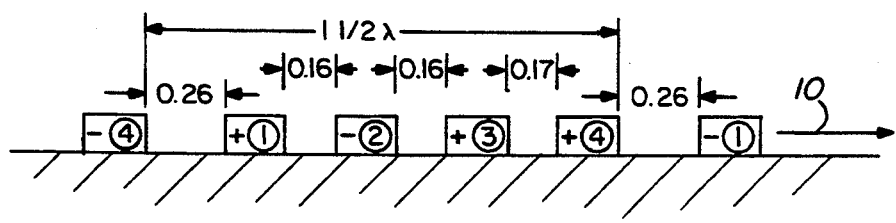
FIG. 12 is a schematic representation of an example of the present embodiment in which a grating structure of the present invention is so constructed with a $1\frac{1}{2}\lambda$ or $2\frac{1}{2}\lambda$ transduction lengths so as to cause substantially unidirectional reflectivity towards each other.

FIG. 12 illustrates reflector grating electrodes of the present invention in a pattern that was actually constructed to achieve the desired results set forth earlier. In the present example, the electrode widths are 3λ/16, although that is not critical to the invention. Any desired width of the electrodes can be used. The electrode widths merely need to be equal in any case. The minimum transduction length is 1½λ but could also be 2½λ in length and the computer is asked to move the electrodes 1, 2, 3, and 4 within that minimum transduction length such that for a given frequency, a desired internal localized reflection coefficient is achieved both in phase and magnitude. For example, the electrode positions in FIG. 12 have been chosen such that unidirectionality will occur substantially to the right as shown by arrow 10. The actual example obtained as shown had four electrodes within 1½λ with repeating gaps including a first gap of 0.26λ, a second gap of 0.16λ, a third gap of 0.16λ, and a fourth gap of 0.17λ. With such a computer-generated positioning of the electrodes 1, 2, 3 and 4, the grating structure in the example radiates substantially to the right as illustrated by arrow 10. Thus, the grating structure is substantially unidirectional in the direction indicated. If a mirror image of the grating structure in FIG. 12 were produced, it would radiate in the opposite direction.

Figure 13:
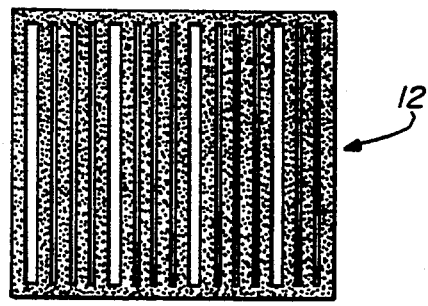
FIG. 13 is a plan view of a grating structure of the present invention illustrating the repeating pattern of the example in FIG. 12.

FIG. 13 is a plan view of at least a portion of a grating structure 12 illustrating the repetitive pattern of electrodes as set forth in FIG. 12.

Clearly, the novel reflector gratings disclosed herein implements a desired internal distributed reflectivity in both magnitude and phase. It is accomplished by positioning four electrodes in a given transduction length of the grating such as 1½λ or 2½λ so that a desired internal distributed reflectivity other than zero is obtained. Thus because the internal distributed reflectivity can be predetermined in magnitude and phase, a substantially unidirectional grating structure may be obtained with a simple pattern of single-level electrodes.

While the invention has been described in connection with a preferred embodiment, it is not intended to limit the scope of the invention to the particular form set forth, but, on the contrary, it is intended to cover such alternatives, modifications, and equivalents as may be included in the spirit and scope of the invention as defined by the appended claims.

I claim:

1. An improved surface acoustic wave reflector grating structure having a transduction length and comprising:
    a piezoelectric substrate;
    a pattern of electrodes on the substrate in the transduction length, the pattern being formed of four equal width, single-level, interdigitated electrodes substantially per each 1½ transduction wavelengths of the grating structure; and
    a non-uniform spacing between said electrodes within the grating transduction length such that a desired reflectivity other than zero is obtained.

2. An improved surface acoustic wave reflector grating structure having a transduction length and comprising:
    a piezoelectric substrate;
    a pattern of electrodes on the substrate in the transduction length, the pattern being formed of four equal width, single-level, interdigitated electrodes substantially per each 2½ transduction wavelengths of the grating structure; and
    a non-uniform spacing between said electrodes within the grating transduction length such that a desired reflectivity other than zero is obtained.

3. An improved surface acoustic wave grating structure as in claim 1 wherein the spacing of the electrodes obtains a reflectivity that is substantially unidirectional.

4. An improved surface acoustic wave grating as in claim 2 wherein the spacing of the electrodes obtains a reflectivity that is substantially unidirectional.

5. An improved surface acoustic wave grating structure having a transduction length and comprising:
    a pattern of equal width, single-level electrodes on a piezoelectric substrate, said electrodes extending over at least 1½ transduction wavelengths;
    essentially four interdigitated electrodes per 1½ wavelengths across the entire transduction length of the grating structure; and
    a non-uniform spacing between said electrodes within the grating transduction length such that a substantially unidirectional grating structure is obtained.

6. An improved surface acoustic wave grating structure having a transduction length and comprising:
    a pattern of equal width, single level electrodes on a piezoelectric substrate, said electrodes extending over at least 2½ transduction wavelengths;
    essentially four interdigitated electrodes per 2½ wavelengths across the entire transduction length of the grating structure; and
    a non-uniform spacing between said electrodes within said grating transduction length such that a substantially unidirectional grating structure is obtained.

* * * * *